US006587065B1

(12) United States Patent
Hensley et al.

(10) Patent No.: US 6,587,065 B1

(45) Date of Patent: Jul. 1, 2003

(54) STABLE CURRENT-CONTROL REFERENCE SYSTEMS

(75) Inventors: Joseph Michael Hensley, Kernersville, NC (US); Michael R. Elliott, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/136,895

(22) Filed: Apr. 29, 2002

(51) Int. Cl.[7] ................................................ H03M 1/14

(52) U.S. Cl. ....................................... 341/161; 341/155

(58) Field of Search ................................ 341/155, 144, 341/161, 159; 330/289

(56) References Cited

U.S. PATENT DOCUMENTS 5,084,700 A * 1/1992 Christopher ................ 341/118
5,859,569 A * 1/1999 Le et al. ..................... 341/155
5,905,617 A 5/1999 Kawasoe
5,940,322 A 8/1999 Atsumi
6,104,231 A 8/2000 Kirkpatrick
6,166,566 A 12/2000 Strong
6,191,989 B1 2/2001 Luk et al.

* cited by examiner

*Primary Examiner*—Brian Young

(74) *Attorney, Agent, or Firm*—Koppel, Jacobs, Patrick & Heybl

(57) ABSTRACT

Current-control reference systems are provided in which stabliity is realized with sensors that shift clamp windows in response to a reference's current-control signal to thereby maintain feedback control in the reference under steady-state and transient operating conditions.

26 Claims, 3 Drawing Sheets

STABLE CURRENT-CONTROL REFERENCE SYSTEMS

BACKGROUND OF THE INVENTION

1. Field of the Invention

The present invention relates generally to reference systems.

2. Description of the Related Art

Accurately-controlled currents are required in a number of modern electronic systems. For example, switched-current digital-to-analog converters (DACs) convert digital input signals to corresponding analog current signals with current sources which have corresponding switches that respond to the digital input signals. Because the accuracy of the current sources determines the conversion accuracy, they have generally been biased with reference signals that maintain substantially-constant currents despite parameter variations (e.g., base-emitter voltages) in the current-carrying devices (e.g., bipolar junction transistors).

Feedback-controlled circuits have been developed that realize effective steady-state current-control reference signals. Because these feedback circuits tend to have instability problems, however, they have sometimes been augmented with clamps which attempt to restrain signal movements until the feedback control stabilizes. Although the use of clamps indicates promise, it has generally been found that instability problems still persist in these feedback-controlled circuits.

BRIEF SUMMARY OF THE INVENTION

The present invention is directed to stable current-control reference systems. Stability has been realized in these systems with sensors that shift clamp windows in response to a reference's current-control signal to thereby maintain feedback control in the reference under steady-state and transient operating conditions.

The novel features of the invention are set forth with particularity in the appended claims. The invention will be best understood from the following description when read in conjunction with the accompanying drawings.

DETAILED DESCRIPTION OF THE INVENTION

Figure 1:
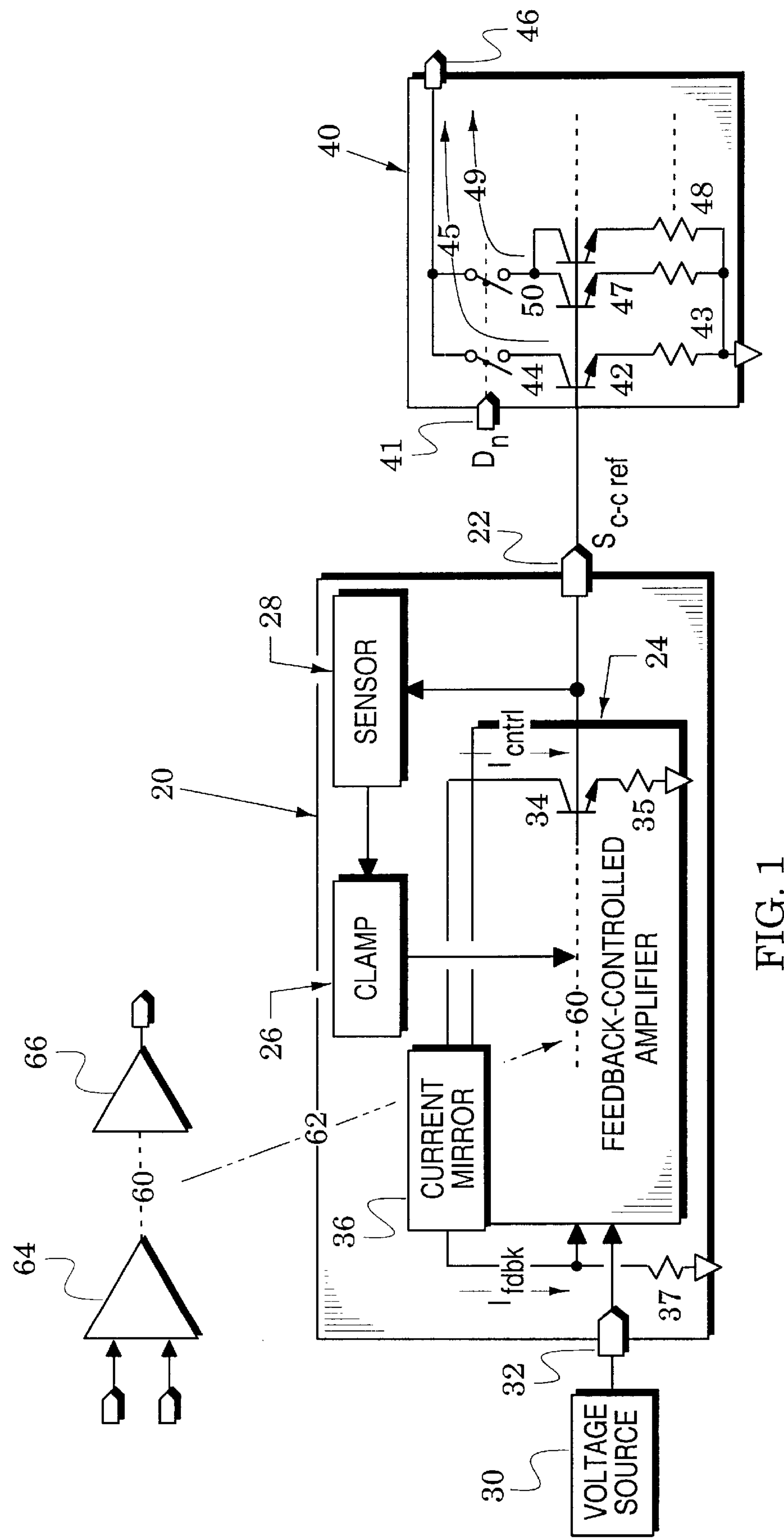
FIG. 1 is a block diagram of a reference system embodiment of the present invention.
Figure 2:
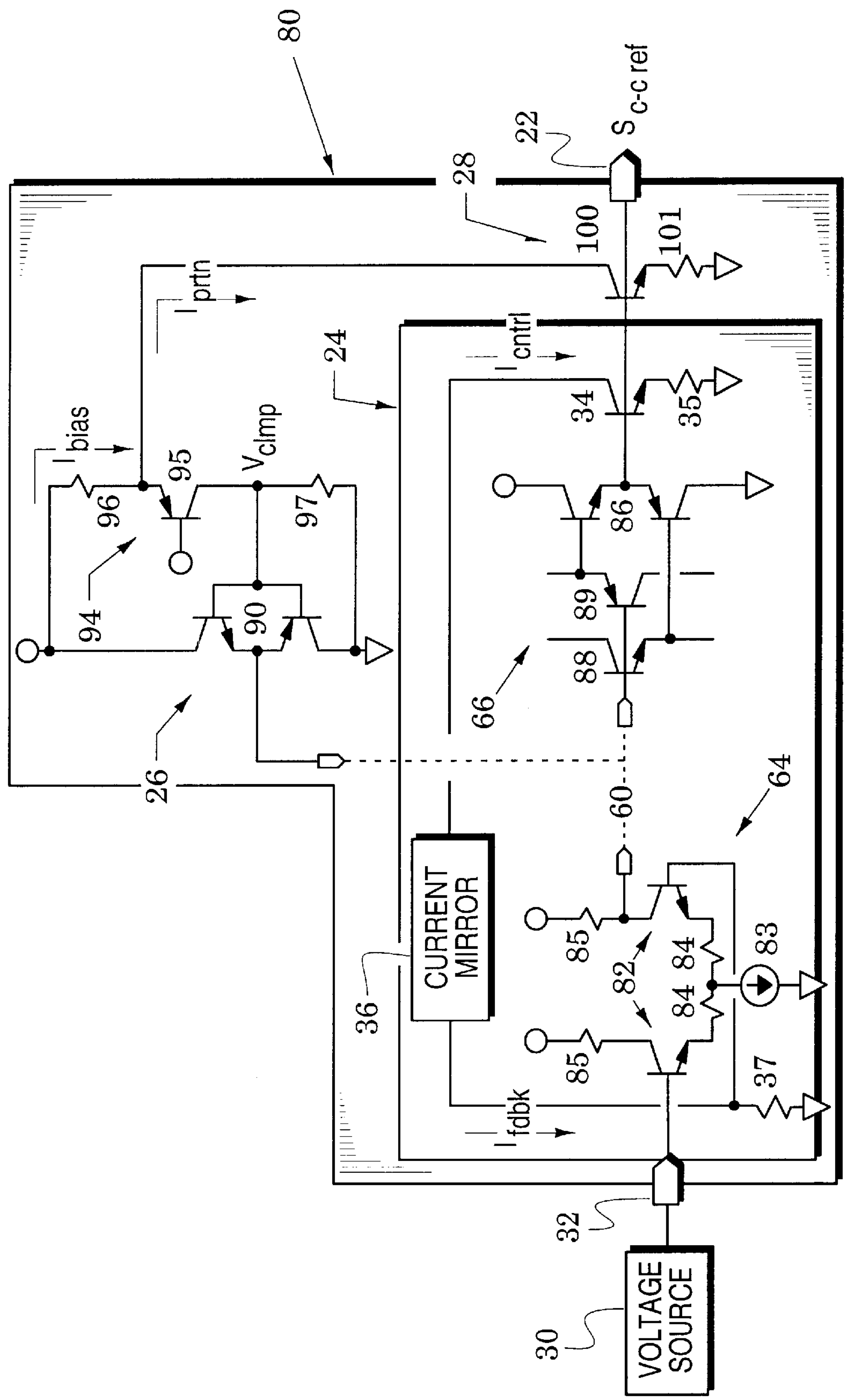
FIG. 2 is a schematic diagram of another reference system embodiment.

FIGS. 1 and 2 illustrate stable current-control reference system embodiments that provide current-control reference signals which are particularly suited for maintaining constant currents in a variety of systems such as switched-current DACs.

In particular, FIG. 1 illustrates a current-control reference system embodiment 20 that generates a current-control reference signal $S_{c\text{-}c\ ref}$ at an output port 22. The system includes a feedback-controlled amplifier 24, a clamp 26 and a sensor 28. A reference voltage $V_{ref}$ is provided (e.g., by a voltage source 30) at an input port 32 of the amplifier. At the output port 22, the amplifier is terminated with a feedback transistor 34 (and an associated resistor 35) which provides a control current $I_{cntrl}$ that is mirrored by a current mirror 36 of the amplifier to form a feedback current $I_{fdbk}$ that terminates at a resistor 37.

Preferably, the voltage source 30 is a source (e.g., a bandgap-type source) such that the reference voltage $V_{ref}$ is substantially constant over temperature and power-supply variations. With access to this reference voltage $V_{ref}$, the feedback control of the amplifier 20 causes the feedback current $I_{fdbk}$ to be substantially constant so that the control current $I_{cntrl}$ is also substantially constant. Accordingly, the current-control reference signal. $S_{c\text{-}c\ ref}$ maintains a constant control current $I_{cntrl}$ in the feedback transistor 34 despite operational changes (e.g., temperature-induced changes) in the base-emitter voltage $V_{be}$ of the transistor.

The current-control reference signal $S_{c\text{-}c\ ref}$ is especially suited for maintaining constant currents in a variety of systems. For example, FIG. 1 also shows a switched-current DAC 40 which converts digital signals $D_n$ at a digital input port 41 to corresponding analog current signals at an analog output port 46. In the DAC 40, a least-significant bit. (LSB) transistor 42 forms a current source with an associated resistor 43. When an associated switch 44 is closed in response to an LSB ($D_0$) input, an LSB current 45 is provided at the output port 46.

Similar current-source structures are provided for the other digital bits. As an example, a pair of transistors 47 (and associated resistors 48) forms a more-significant current source. A more-significant current 49 is therefore provided at the output port 46 in response to a more-significant bit ($D_1$) input.

As described above, the current-control reference signal $S_{c\text{-}c\ ref}$ maintains a constant control current $I_{cntrl}$ in the feedback transistor 34 during operational changes such as temperature-induced changes. Accordingly, it will also maintain constant currents in the transistors 42 and 47 of the switched-current DAC 40 which significantly enhances the DAC's performance.

During turn on of the feedback-controlled amplifier 24, however, the voltages along a signal path 60 typically tend to initially move toward a supply limit (e.g., a supply voltage $V_{CC}$). Before the feedback loop can stabilize, this movement may cause a feedback element (e.g., the. feedback transistor 34) to reach an operational limit (e.g., saturation) so that the feedback action is terminated and the current-control reference system is locked at a limit position.

In the reference system 20, this limit process is prevented by the clamp 26 which establishes a clamp window that is coupled to the signal path 60 to thereby limit signal excursions on the path to the extent of the clamp window. Transient signals (e.g., switching and power supply noise) may significantly disturb the level of the signal path 60 during steady-state operation. In addition, slight variations (e.g., due to resistor or $V_{be}$ mismatch) may require that the nominal level of the clamp window is set lower or higher to ensure the static clamping circuit functions properly.

If the clamp window is adjusted to compensate for these real-world conditions, the clamp 26 may not perform dynamically as required. For example, if these disturbances urge the level too close to either limit of the clamp 26, the clamp may reduce the amplifier's loop gain with consequent degradation of the reference system's steady-state performance. From this perspective, it is desirable to widen the clamp window and center it about the steady-state level of the signal path 60.

Under some combinations of operational conditions (e.g., temperature variations and power supply variations), however, a wider clamp window may permit transient levels of the signal path 60 that limit feedback elements so that the system's operation is terminated. From this perspective, it is desirable to narrow the clamp window or offset the clamp window from a steady-state value.

The sensor 28 resolves these conflicting considerations by shifting the clamp window in response to transient values of the current-control reference signal $S_{c\text{-}c\ ref}$. Thus, the clamp window may be narrowed and centered to enhance steady-state operation but transiently shifted to guard against transient conditions that would otherwise terminate system operation.

An insertion arrow 62 in FIG. 1 indicates that the signal path 60 may be the path between a differential amplifier 64 and a buffer 66 that provides a high input impedance. These elements are exemplified in FIG. 2 which illustrates a current-control reference system 80 that also generates a current-control reference signal $S_{c\text{-}c\ ref}$ at an output port 22. The system 80 includes other elements of the system 20 with like elements indicated by like reference numbers.

In the system 80, the differential amplifier 64 is formed from a differential pair 82 of transistors that differentially steer current from a current source 83 through associated emitter resistors 84 and collector loads 85. The signal path 60 is buffered through the use of a high input-impedance buffer 66 in the form of a complementary emitter-follower stage 86 that is driven by corresponding emitter followers 88 and 89. In response to the differential amplifier 64 and buffer 66, the feedback transistor 34 generates a control current $I_{cntrl}$ which is mirrored by the current mirror 36 to form a feedback current $I_{fdbk}$ that is received by the resistor 37.

In the system 80, the clamp 26 is a complimentary emitter-follower stage 90 whose bases are coupled to a clamp voltage $V_{clmp}$ and whose emitters are coupled to the signal path 60. The clamp voltage is established by a bias circuit 94 that comprises a bias transistor 95 which directs a bias current $I_{bias}$ through an emitter resistor 96 and a collector resistor 97. The base of the bias transistor receives a bias voltage (from any of various conventional bias sources) which sets the bias current $I_{bias}$. Current flow through the collector resistor 97 establishes the clamp voltage $V_{clmp}$.

In the system 80, the sensor 28 is a sense transistor 100 whose base is coupled to the current-control reference signal $S_{c\text{-}c\ ref}$, whose emitter is coupled to a resistor 101 and whose collector is coupled to the emitter of the bias transistor 95. Accordingly, the sense transistor 100 is coupled to divert a portion $I_{prtn}$ of the bias current $I_{bias}$ in response to the current-control reference signal $S_{c\text{-}c\ ref}$. This diversion reduces current flow through the collector resistor 97 and thereby reduces the clamp voltage $V_{clmp}$.

In operation of the current-control system 80, the feedback action of the amplifier 24 causes the voltage across the resistor 37 to be substantially that delivered by the voltage source 30 so that the feedback current $I_{fdbk}$ and the control current $I_{cntrl}$ are held substantially constant. Thus, the current-control reference signal $S_{c\text{-}c\ ref}$ maintains a constant control current $I_{cntrl}$ in the feedback transistor 34 despite changes (e.g., temperature-induced changes) in the base-emitter voltage $V_{be}$ of this transistor.

The complementary emitter-follower stage 90 establishes a clamp window for the signal path 60 that comprises a base-emitter voltage $V_{be}$ above and below the clamp voltage $V_{clmp}$ that is generated by flow of the bias current $I_{bias}$ through the collector resistor 97. The clamp voltage, however, is shifted by changes in the current portion $I_{prtn}$ that is diverted by the sense transistor 100. The current Portion $I_{prtn}$ has a quiescent value when the current-control reference signal $S_{c\text{-}c\ ref}$ is at its steady-state level.

Transient circuit disturbances (e.g., a turn-on surge), however, will cause the sense transistor 100 to generate transient values of the current portion $I_{prtn}$ and this transient action alters the bias current $I^{bias}$ and the clamp voltage $V_{clmp}$. The clamp window at the output of the complimentary emitter-follower stage 90 is thus responsive to transient values of the current-control reference signal $S_{c\text{-}c\ ref}$.

Therefore, the clamp window at the signal path 60 of FIG. 2 may be narrowed and centered about a quiescent value that enhances steady-state operation of the feedback-controlled amplifier 24. In response to transient values of the reference signal $S_{c\text{-}c\ ref}$, the sensor transistor 100 will then shift the narrow clamp window to levels that enhance transient operation.

In an exemplary transient situation, the voltage of the signal path 60 rapidly increases at turn on of the amplifier 24 and the voltage source 30. This increase should be terminated by current feedback through the current mirror 36 but under some combinations of operational parameters (e.g., temperature and power supply variations), a circuit element (e.g., the feedback transistor 34) may reach a limit (e.g., saturation) before the feedback action can stabilize the amplifier 24 and the amplifier is then locked into a fault condition.

In this exemplary situation, however, the sense transistor 100 responds to the increasing voltage on the signal path 60 by diverting a greater current portion $I_{prtn}$ from the bias current $I_{bias}$ so that the clamp voltage $V_{clmp}$ and the clamp window are shifted lower. Accordingly, the lower transistor of the complementary emitter-follower stage 90 turns on sooner and halts the voltage increase of the signal path so that the feedback action of the amplifier 24 stabilizes the system.

Figure 3:
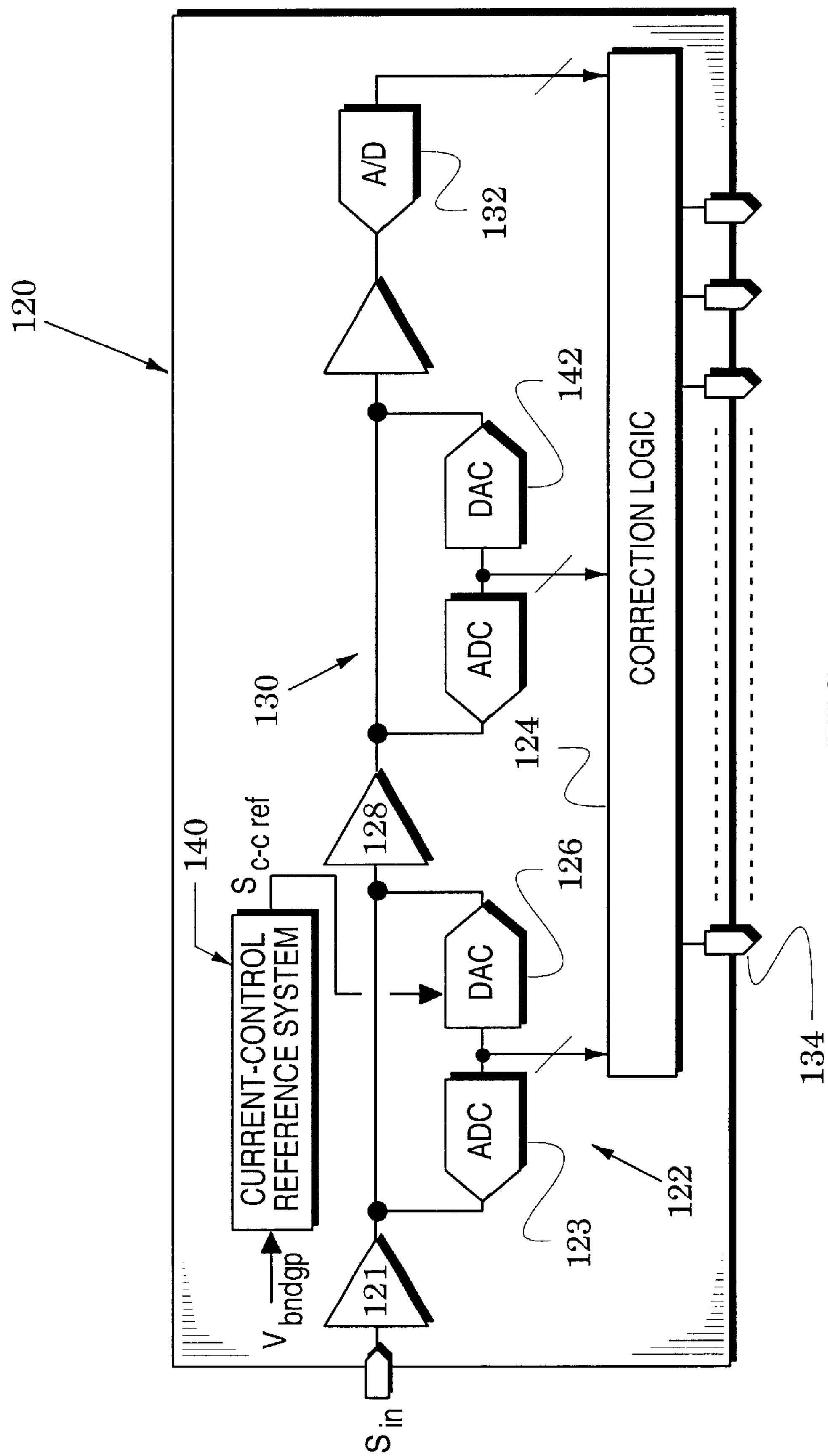
FIG. 3 is a block diagram of a pipelined analog-to-digital converter (ADC) system which includes a reference system in accordance with the reference teachings of FIGS. 1 and 2.

FIG. 3 illustrates a pipelined ADC 120 which samples analog input signals $S_{in}$ with a sample-and-hold amplifier (SHA) 121 and converts the sampled signals to more-significant bits (MSBs) in an initial pipeline stage 122 with an ADC 123 (e.g., a flash ADC). These MSBs are coupled to a correction logic 124 and are also converted to a corresponding analog signal in a DAC 126. The corresponding signal is, subtracted from the sampled signals to produce an analog residue signal that is gained up in another SHA 128 and passed to a similar subsequent pipeline stage 130.

At the end of this process, a final ADC 132 generates the LSBs and passes them to the correction logic 124, which time aligns the converted signals of all stages to thereby generate the output digital signal at output ports 134. In particular pipelined ADCs, additional amplifiers and/or SHAs may be inserted along the, pipeline.

In an embodiment of the pipelined ADC 120, the DAC 126 is a switched-current DAC. Accordingly, the performance of the DAC 126 is enhanced by biasing its current sources with a current-control reference system 140 that is in accordance with selected teachings of the reference systems 20 and 80 of FIGS. 2 and 3. The reference system 140 preferably locks its feedback loop to a band-gap voltage reference $V_{bndgp}$. As described above, the reference system 140 will provide a current-control reference signal $S_{c\text{-}c\ ref}$ that will maintain substantially constant currents in the current sources of the switched-current DAC 126.

In a pipelined embodiment, the reference signal of the reference system 140 is also provided to the DAC 142 of the subsequent pipelined stage 130. In a different embodiment, the stage 130 is provided with its own feedback-controlled amplifier (e.g., one similar to the amplifier 24 of FIG. 2) and the control current of this amplifier is offset from that in the current-control reference system 140 to calibrate out inter-stage errors that result from various effects (e.g., tracking gain errors, resistor mismatches and $V_{be}$ mismatches).

Although clamp windows of the invention (e.g., the clamp window of the clamps 26 of FIGS. 1 and 2) can be established on various signal paths, they are preferably established on a high-impedance path that is realized with a buffer such as the buffer 66 of FIG. 2.

Embodiments of the invention have been illustrated with bipolar junction transistors but other equivalent embodiments may be formed with substitution of different transistors (e.g., metal-oxide semiconductor (MOS) transistors).

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A reference system that provides a current-control reference signal, comprising:

a feedback-controlled amplifier that includes a feedback transistor and provides a current-control reference signal which maintains a substantially-constant control current in said feedback transistor;

a clamp that limits signal excursions on a signal path of said feedback-controlled amplifier to a clamp window; and a sensor that shifts said clamp window in response to transient values of said current-control reference signal;

feedback control thereby maintained about said amplifier.

2. The system of claim 1, wherein said clamp is a complementary emitter-follower stage that is coupled to said signal path.

3. The system of claim 1, wherein;

said clamp window is responsive to a bias current: and said sensor includes a sense transistor that diverts a portion of said bias current in response to said current-control reference signal.

4. The system of claim 1, further including a bias circuit that establishes a clamp voltage and wherein:

said clamp includes at least one clamp transistor that is coupled to said signal path and responds to said clamp voltage; and said sensor diverts current from said bias circuit to shift said clamp voltage.

5. The system of claim 1, further including a bias transistor that establishes a clamp voltage by directing a bias current through a resistance and wherein:

said clamp includes first and second clamp transistors whose bases are coupled to said clamp voltage and whose emitters are coupled to said signal path; and said sensor includes a sense transistor that diverts a portion of said bias current in response to said current-control reference signal;

emitters of said first and second clamp transistors thereby providing said clamp window.

6. The system of claim 1, wherein said feedback-controlled amplifier includes:

a differential amplifier;

an output, buffer coupled via said signal path to said differential amplifier; and a current mirror that provides a feedback current to said differential amplifier in response to said control current.

7. The system of claim 6, wherein:

said differential amplifier includes a differential pair of transistors; and said output buffer includes a complementary emitter follower that provides said current-control reference signal in response to said differential pair.

8. The system of claim 1, further including a voltage source that provides a reference voltage to said feedback-controlled amplifier.

9. The system of claim 8, wherein said voltage source is a bandgap-controlled voltage source.

10. A reference system that provides a current-control reference signal in response to an input voltage, comprising:

a feedback-controlled amplifier that includes a feedback transistor and, in response to said input voltage, provides a current-control reference, signal which maintains a substantially-constant control current in said feedback transistor;

a bias circuit that establishes a clamp voltage;

a clamp that responds to said clamp voltage and limits signal excursions on a signal path of said feedback-controlled amplifier to a clamp window; and a sensor that responds to transient values of said current-control reference signal and modifies currents in said bias circuit to thereby shift said clamp window.

11. The system of claim 10, wherein said bias circuit includes a bias transistor that establishes said clamp voltage by directing a bias current through a resistance.

12. The system of claim 10, wherein said clamp is a complementary emitter-follower stage that is coupled to said signal path.

13. The system of claim 10, wherein:

said clamp includes at least one clamp transistor that is coupled to said signal path and responds to said clamp voltage; and said sensor includes a sense transistor that diverts current from said bias circuit to shift said clamp voltage.

14. The system of claim 1, wherein:

said bias circuit includes a bias transistor that establishes said clamp voltage by directing a bias current through a resistance and wherein:

said clamp includes first and second clamp transistors whose bases are coupled to said clamp voltage and whose emitters are coupled to said signal path; and said sensor includes a sense transistor that diverts a portion of said bias current in response to said current-control reference signal;

emitters of said first and second clamp transistors thereby providing said clamp window.

15. The system of claim 10, wherein said feedback-controlled amplifier includes:

a differential amplifier that receives said input voltage;

an output buffer coupled via said signal path to said differential amplifier; and a current mirror that provides a feedback current to said differential amplifier in response to said control current.

16. The system of claim 15, wherein:

said differential amplifier includes a differential pair of transistors; and said output buffer includes a complementary emitter follower that provides said current-control reference signal in response to said differential pair.

17. A pipelined analog-to-digital converter (ADC) system that converts an analog signal to a digital signal, the system comprising:

a pipelined ADC that includes an initial converter stage and at least one subsequent converter stage that each convert a respective analog signal to a respective digital signal with a respective ADC, convert said respective digital signal to a corresponding analog signal with a respective digital-to-analog converter (DAC) and pass a respective residue signal that is the difference between said respective and corresponding analog signals to a subsequent converter stage; and a reference system that provides a current-control reference signal to at least one of said initial and subsequent converter stages wherein said reference system includes:

a) a feedback-controlled amplifier that includes a feedback transistor and provides said current-control reference signal which maintains a substantially-constant control current in said feedback transistor;

b) a clamp that limits signal excursions on a signal path of said feedback-controlled amplifier to a clamp window; and c) a sensor that shifts said clamp window in response to transient values of said current-control reference signal; feedback control thereby maintained about said amplifier.

18. The system of claim 17, wherein said clamp is a complementary emitter-follower stage that is coupled to said signal path.

19. The system of claim 17, wherein;

said clamp window is responsive to a bias current: and said sensor includes a sense transistor that diverts a portion of said bias current in response to said current-control reference signal.

20. The system of claim 17, further including a bias circuit that establishes a clamp voltage and wherein:

said clamp includes at least one clamp transistor that is coupled to said signal path and responds to said clamp voltage; and said sensor diverts current from said bias circuit to shift said clamp voltage.

21. The system of claim 17, further including a bias transistor that establishes a clamp voltage by directing a bias current through a resistance and wherein:

said clamp includes first and second clamp transistors whose bases are coupled to said clamp voltage and whose emitters are coupled to said signal path; and said sensor includes a sense transistor that diverts a portion of said bias current in response to said current-control reference signal;

emitters of said first and second clamp transistors thereby providing said clamp window.

22. The system of claim 17, wherein said feedback-controlled amplifier includes:

a differential amplifier;

an output buffer coupled via said signal path to said differential amplifier; and a current mirror that provides a feedback current to said differential amplifier in response to said control current.

23. The system of claim 22, wherein:

said differential amplifier includes a differential pair of transistors; and said output buffer includes a complementary emitter follower that provides said current-control reference signal in response to said differential pair.

24. The system of claim 17, further including a voltage source that provides a reference voltage to said feedback-controlled amplifier.

25. The system of claim 17, wherein said voltage source is a bandgap-controlled voltage source.

26. The system of claim 17, wherein said pipelined ADC further includes a correction logic that processes the respective digital signals of said initial and subsequent converter stages.

* * * * *